United States Patent [19]
Ravazzi et al.

[11] Patent Number: 6,067,250
[45] Date of Patent: May 23, 2000

[54] METHOD AND APPARATUS FOR LOCALIZING POINT DEFECTS CAUSING LEAKAGE CURRENTS IN A NON-VOLATILE MEMORY DEVICE

[75] Inventors: Leonardo Ravazzi, Dalmine; Giuseppe Crisenza, Trezzo Sull'adda, both of Italy

[73] Assignee: STMicroelectronics S.R.L., Agrate Brianza, Italy

[21] Appl. No.: 09/311,257

[22] Filed: May 13, 1999

[30] Foreign Application Priority Data

May 21, 1998 [IT] Italy .................................. MI98A1124

[51] Int. Cl.⁷ .................................................. G11C 16/06
[52] U.S. Cl. ................................ 365/185.09; 365/185.11; 365/185.17; 365/185.26
[58] Field of Search .......................... 365/185.09, 185.11, 365/185.26, 185.17, 200, 201, 189.01, 185.01

[56] References Cited

U.S. PATENT DOCUMENTS

| | | | |
|---|---|---|---|
| 5,043,941 | 8/1991 | Sakamoto | 395/185.1 |
| 5,192,704 | 3/1993 | McDavid et al. | 438/3 |
| 5,359,554 | 10/1994 | Odake et al. | 365/184 |
| 5,508,955 | 4/1996 | Zimmer et al. | 365/185.16 |
| 5,949,718 | 9/1999 | Randolph et al. | 365/185.33 |

*Primary Examiner*—David Nelms
*Assistant Examiner*—Hoai V. Ho
*Attorney, Agent, or Firm*—Wolf, Greenfield & Sacks, P.C.; James H. Morris; Theodore E. Galanthay

[57] ABSTRACT

Method for localizing point defects causing column leakage currents in a non-volatile memory device, said device including a plurality of memory cells arranged in rows and columns in a matrix structure, the columns being connected to drain regions by first contacts, source diffusions, and metal lines which connect the source diffusions to each other by second contacts. The method includes the steps of modifying the memory device in order to eliminate a part of the first contacts and all the second contacts, and to form third contacts, which connect the metal lines to drain regions in rows wherein the first contacts have been eliminated, making the source diffusions independent of each other and halving the initial number of the memory cells; sequentially biasing the single columns of the matrix; sequentially biasing the single rows of the matrix, keeping biased one column; localizing a memory cell which presents the point defects, when the leakage current flow occurs.

6 Claims, 8 Drawing Sheets

METHOD AND APPARATUS FOR LOCALIZING POINT DEFECTS CAUSING LEAKAGE CURRENTS IN A NON-VOLATILE MEMORY DEVICE

BACKGROUND OF THE INVENTION

1. Field of the Invention

The present invention relates to a method and apparatus for localizing point defects causing column leakage currents (IL) between drains and sources, by means of source diffusion addressing in a conventional non-volatile memory device.

2. Discussion of the Related Art

In non-volatile memories, sometimes there are defects causing column (bit line) leakage currents, independent of the voltage applied to the gate electrode (word line). Such leakage currents can be caused by one or more defective contacts or by a conductive path between the drain electrode and the source electrode, e.g. in the silicon substrate, of one or more cells connected to the bit line wherein the above-mentioned leakage currents appear, as well as by contact-polysilicon or metal levels short-circuits, which depend on the particular device.

The use of failure analysis, usually long and delicate, is made extremely hard due to the practical impossibility of localizing the cell in which the leakage defect is located, because all the drain electrodes of the cells connected to the bit line at issue have the same potential value and also all the source electrodes of the matrix cells are short-circuited to each other by means of metal lines.

Figure 1:
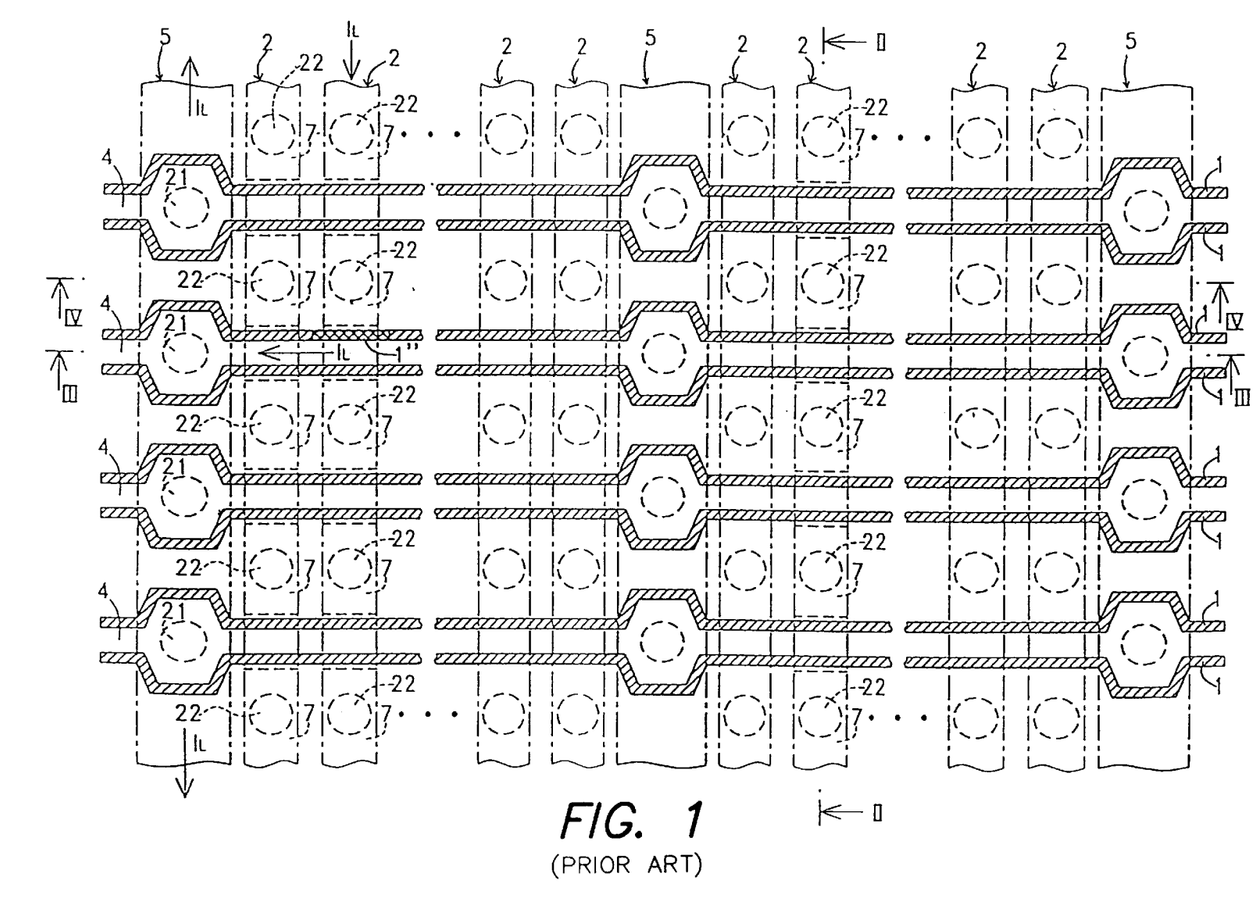
FIG. 1 shows schematically a top view of a matrix of non-volatile memory cells, according to the prior art.

FIG. 1 schematically shows a top view of a matrix portion of memory cells according to the prior art, arranged in couples of rows (word lines 1) and in columns (bit lines 2). To the word lines 1 correspond common source lines (source diffusions 4), which, through source contacts 21, are connected to each other by source metal lines 5 arranged at regular intervals between matrix columns. The bit lines 2 connect, in their turn, respective drain regions 7 lines each other, through drain contacts 22. Insulating oxide layers, not shown in FIG. 1, are interposed between the numerous source and drain regions and the related contacts. The presence of a defective memory cell (notable by means of the different representation 1" in its word line) causes the flow of a leakage current IL.

Figure 2:
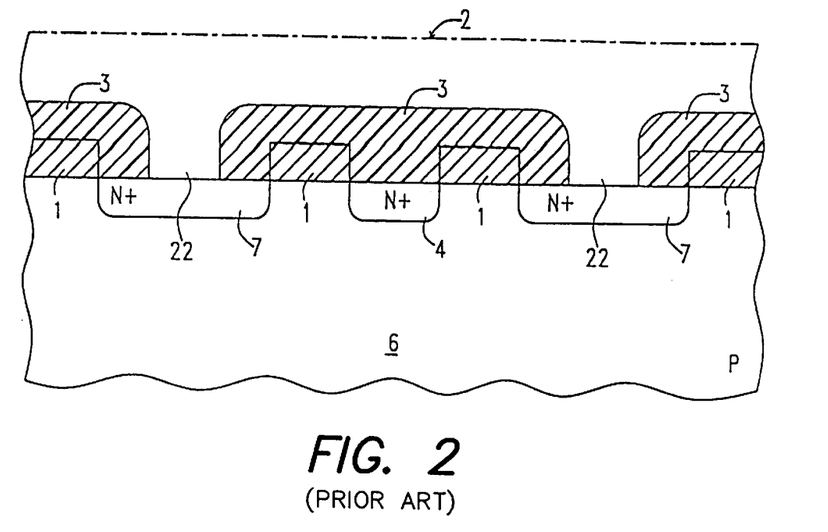
FIG. 2 shows a section view taken along line II—II of FIG. 1.

FIG. 2 schematically shows the section view taken along line II—II of FIG. 1: on a P type substrate 6 there are N+ type silicon regions, corresponding alternatively to source regions 4 and to drain regions 7, gate lines or word lines 1, insulating oxide layers 3, and a bit line 2 connected to the N+ drain regions 7 through contacts 22.

Figure 3:
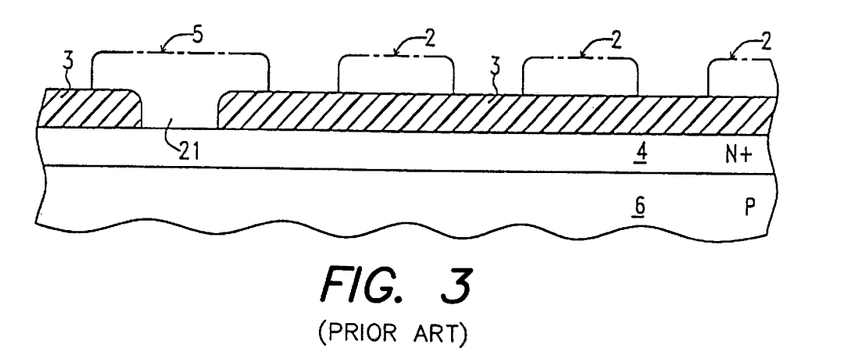
FIG. 3 shows a section view taken along line III—III of FIG. 1.

In FIG. 3, showing schematically a section view taken along line III—III of FIG. 1, it can be noted the metal 5 connected to a N+ type silicon layer corresponding to a source diffusion 4, disposed on the P type substrate 6, and an insulating oxide layer 3 on which some bit lines 2 are disposed. The metal 5 is connected to all the source diffusions through contacts 21.

Figure 4:
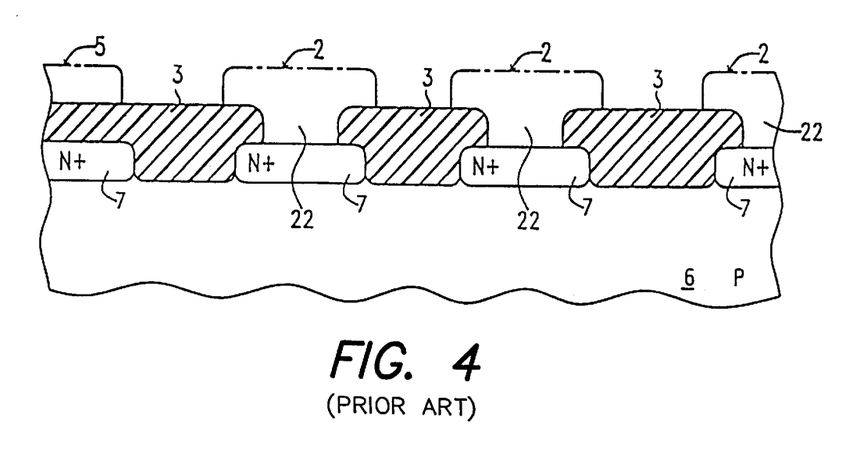
FIG. 4 shows a section view taken along line IV—IV of FIG. 1.

FIG. 4 represents a section view taken along line IV—IV of FIG. 1, showing the metal 5 and the bit lines 2, these last connected through electrodes 22 to their respective N+ type silicon regions 7 formed over the P type substrate 6, and spaced apart by means of insulating oxide regions 3.

Figure 5:
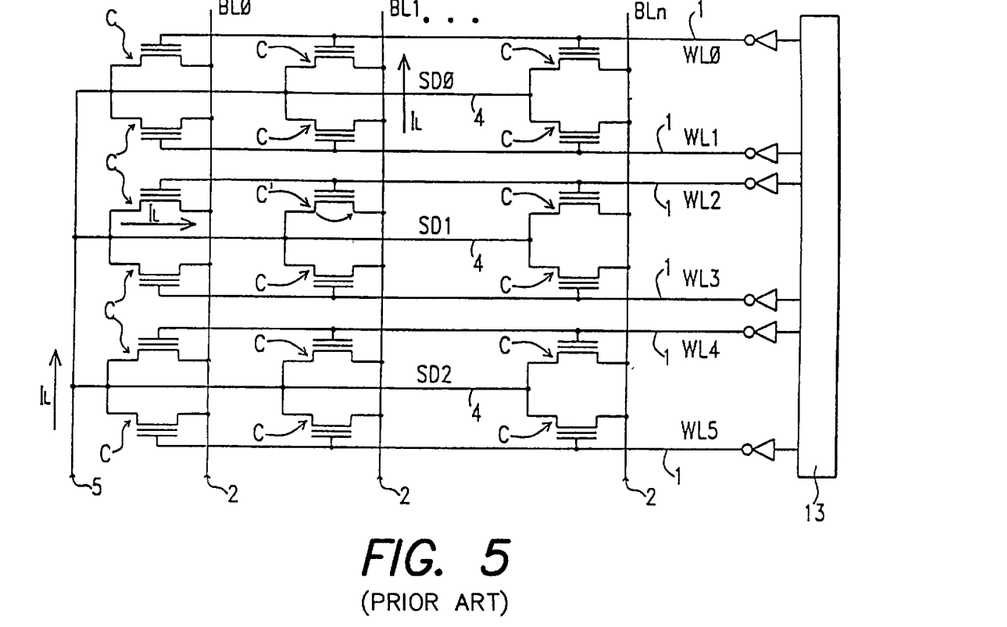
FIG. 5 shows a circuit diagram of the matrix of FIG. 1.

FIG. 5 schematically shows a circuit diagram of the same matrix of FIG. 1, wherein the single memory (C) cells, constituted by N channel MOSFETs, with their related word lines 1 (WL0–WL5), bit lines 2 (BL0–BLn) and source diffusions 4 (SD0–SD2), these last connected to each other by means of metal 5, are more evident. The word lines 1 are addressed by a proper row decoder 13. The presence of the defective cell C' causes the leakage current IL flow in the bit line BL1 wherein said cell is, in the respective source diffusion SD1 and in the metal line 5.

Figure 6:
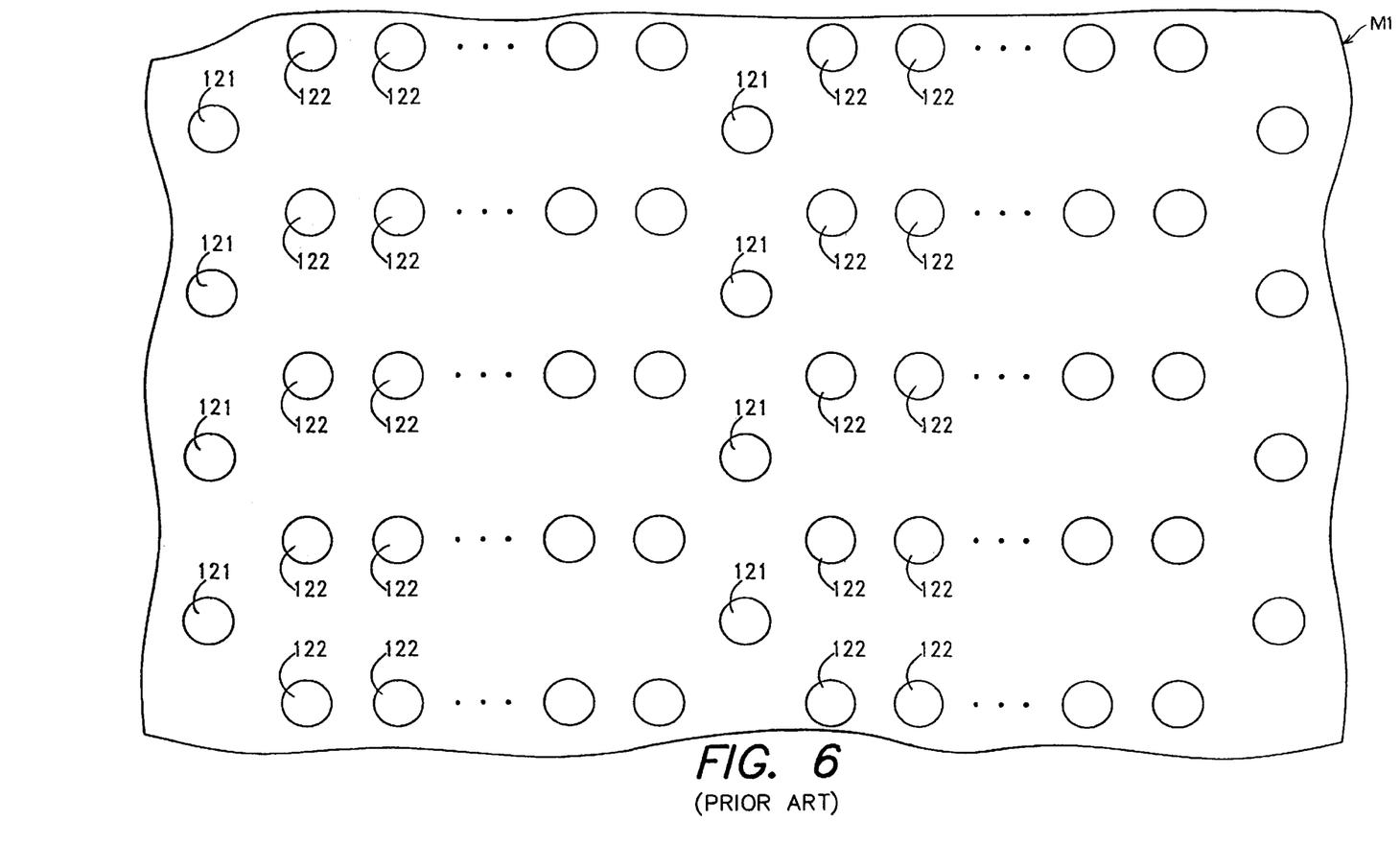
FIG. 6 shows the layout of a contact mask of a portion of the matrix of FIG. 1.
Figure 7:
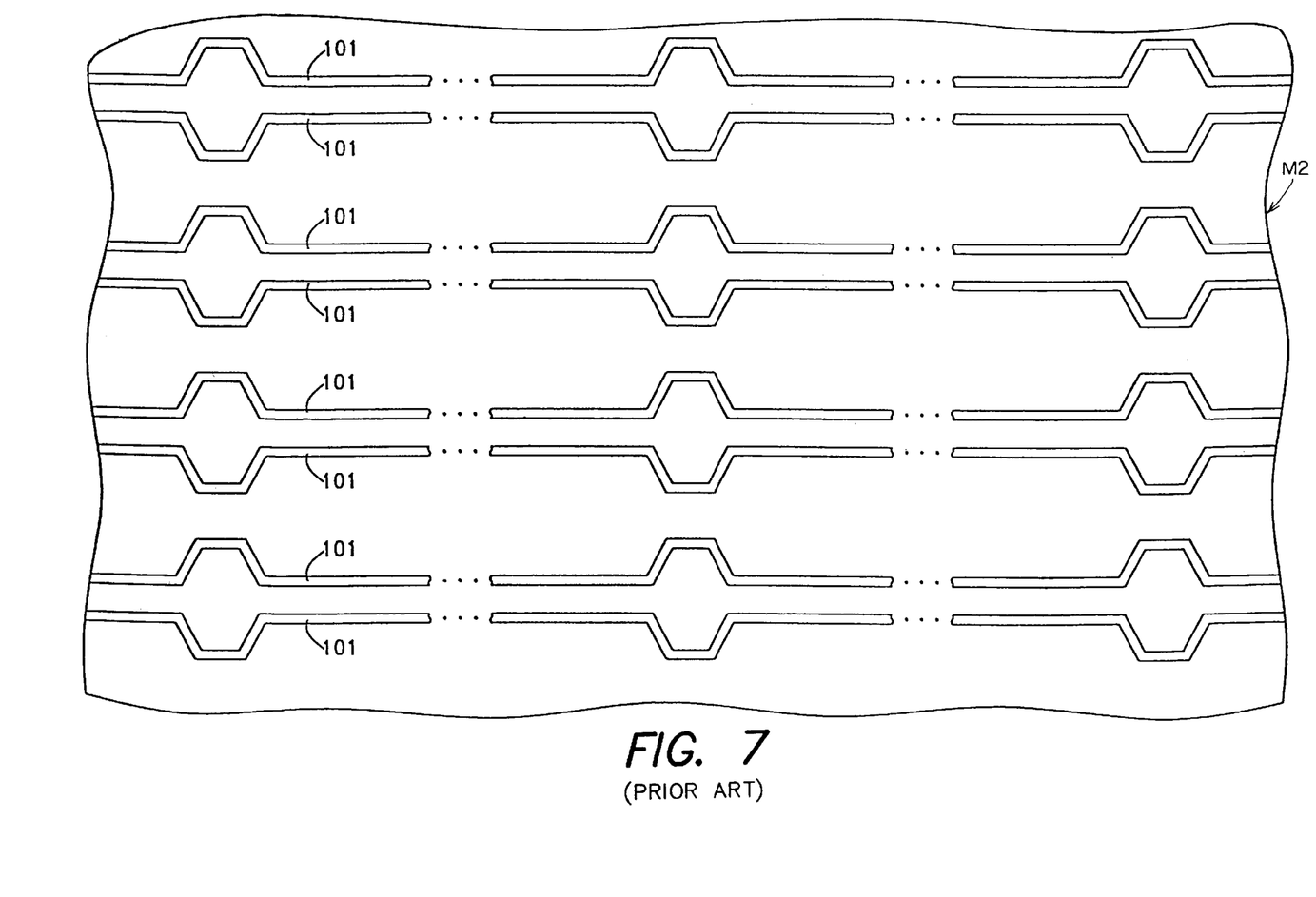
FIG. 7 shows the layout of a mask used for obtaining the word lines of the matrix of FIG. 1.

FIG. 6 shows the layout of a contact mask M1 used for forming contacts 21 and 22 of the matrix of FIG. 1, by means of windows 121 and 122 respectively, during the manufacturing process of the device, whereas FIG. 7 shows the layout of a mask M2 used for obtaining the word lines 1 of the same matrix of FIG. 1, by means of windows 101, during another step of the same manufacturing process.

With a memory cells matrix structured as above-mentioned, the localization of the leakage defect refers to the bit line in which the defective cell (placed in transistor C' of FIG. 5) is inserted, without a possible further localization inside the bit line itself, because of the connection of all the source electrodes of the memory cells: in a fault analysis process, in fact, by biasing the bit line wherein the possible defective cell is, e.g. at 1V, it can be always noted a leakage current IL flow whatever it might be the voltage applied to the word lines.

To address the problem of localizing a possible leakage defect in one or more memory matrix cells, it is necessary to separate the single source diffusions, and moreover for localizing the cell causing the leakage current in a fast and precise way it must be used the circuitry (test mode and sensing) of the current devices by means of word lines and bit lines decoding.

At this point it could be thought of manufacturing a device ad hoc wherein the single source diffusions are decoded separately, like the word lines and the bit lines, but this would involve completely redesigning the device and the device would have a larger size. The mask set of such a device would be completely different compared to a conventional one, and the decision of using such a possibility should be taken as soon as the lot to be worked goes into production.

A solution suitable to addressing every single source diffusion is that of using, for example, the word line decoding, acting in the manufacturing process of the device by means of modifying few manufacturing masks. The matrix cell localization can be so accomplished with a traditional bit line leakage test used during device testing. The rapidity of the test allows the analysis of all the pieces of a wafer and so the achievement of the desired information in a short time and with a large statistical basis.

In view of the state of the art described, it is an object of the present invention to provide a method and apparatus for localizing point defects causing leakage currents in a non-volatile memory device that requires modifying only a minimum number of masks during the manufacturing process of the device itself.

SUMMARY OF THE INVENTION

According to the present invention, this and other objects are achieved by means of a method for localizing point defects causing column leakage currents in a non-volatile memory device, said device comprising a plurality of memory cells arranged in rows and columns in a matrix structure, said columns being connected to drain regions by means of first contacts, source diffusions, and metal lines which connect said source diffusions to each other by means of second contacts, comprising the steps of:

modifying said memory device in order to eliminate a part of said first contacts and all the second contacts, and to form third contacts, which connect said metal lines to drain regions in rows wherein said first contacts have been eliminated, making said source diffusions independent of each other and halving the initial number of said memory cells;

sequentially biasing the single columns of said matrix;

sequentially biasing said single rows of said matrix, keeping biased one column;

localizing a memory cell which presents said point defects, when said leakage current flow occurs.

BRIEF DESCRIPTION OF THE DRAWINGS

The features and advantages of the present invention will be made more evident by the following detailed description of a particular embodiment thereof, illustrated as a non-limiting example in the annexed drawings, wherein.

DETAILED DESCRIPTION

Figure 8:
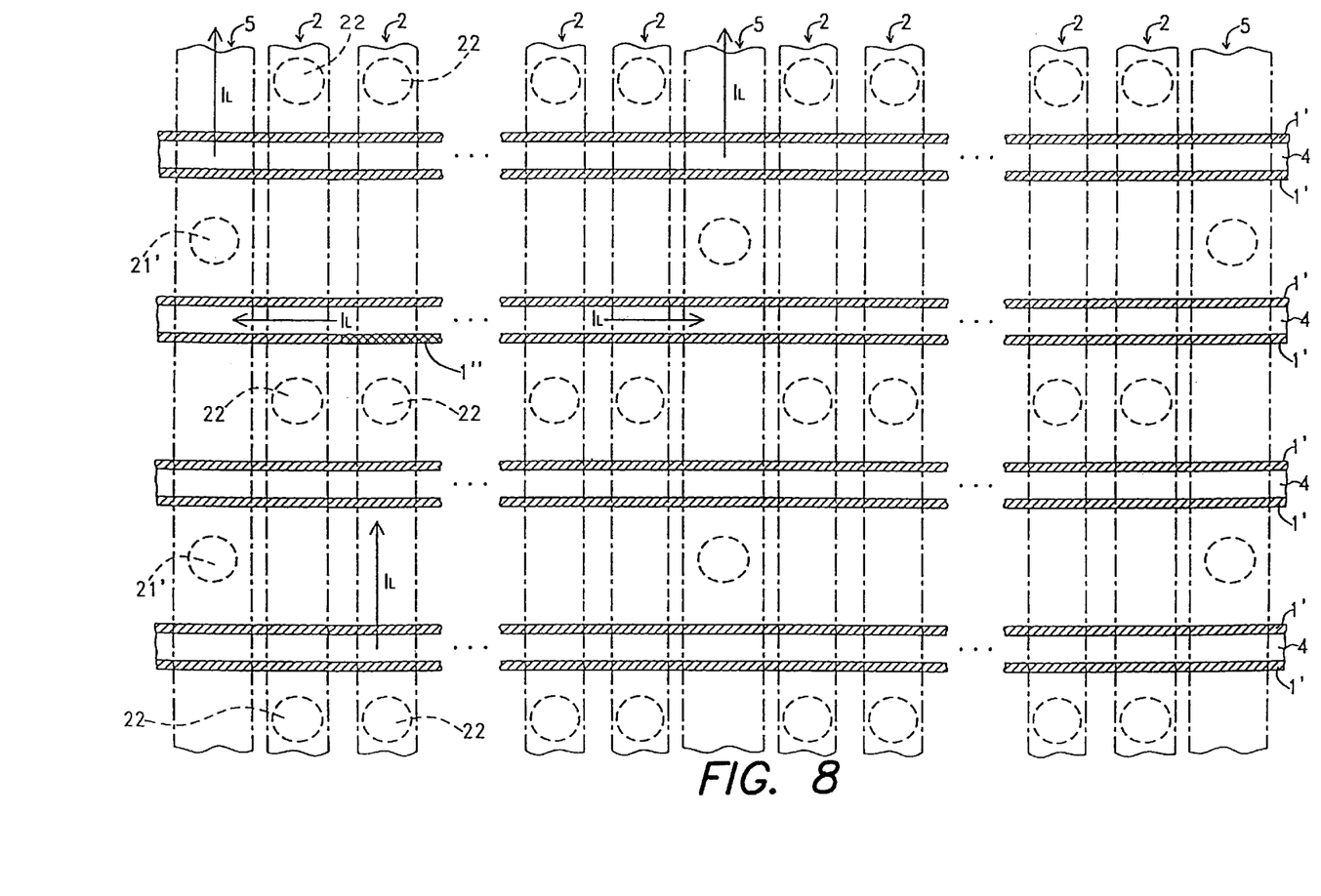
FIG. 8 shows schematically a top view of the same matrix of FIG. 1, modified according to an embodiment of the present invention.
Figure 10:
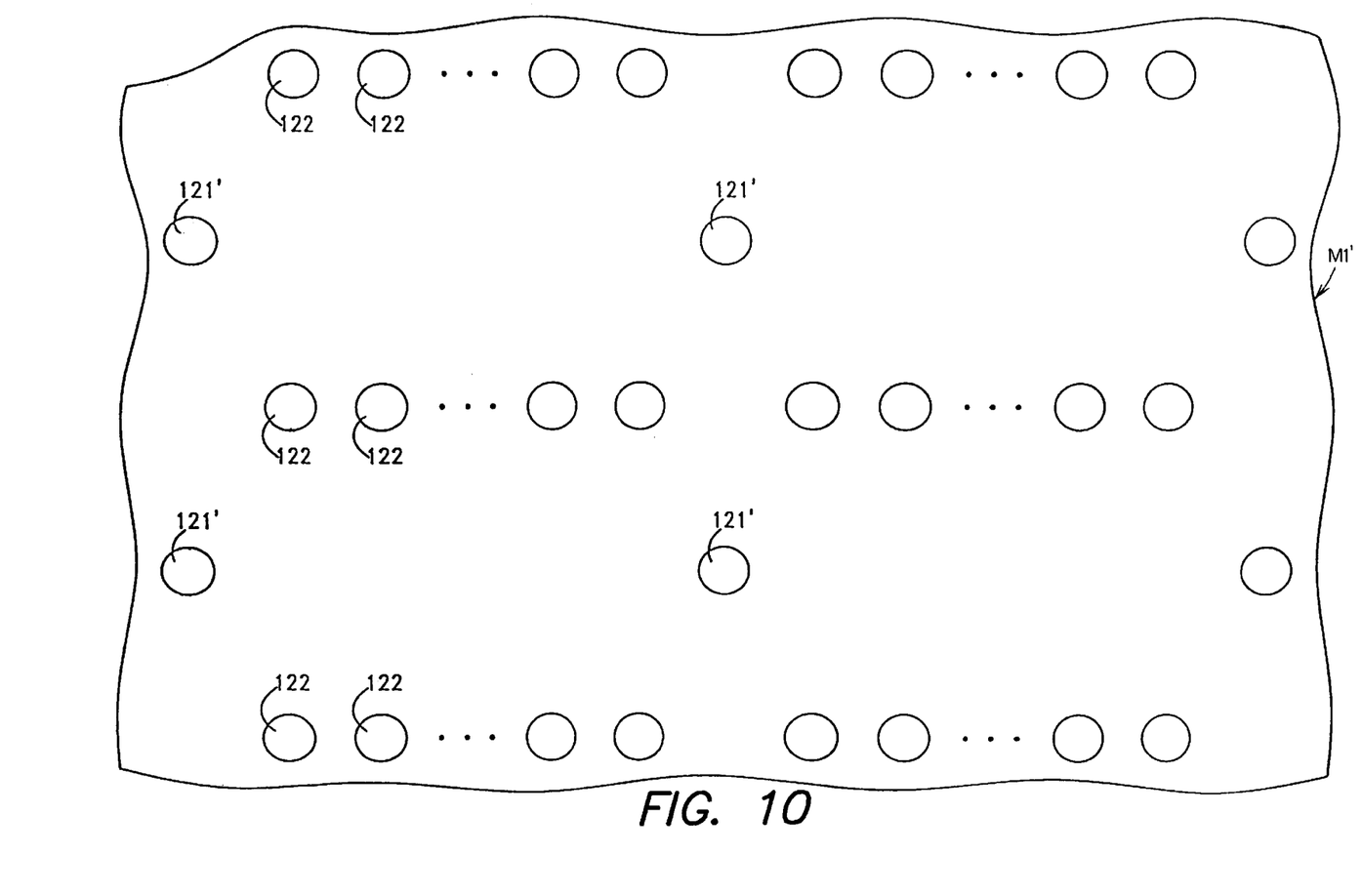
FIG. 10 shows the layout of a contact mask of a part of the matrix of FIG. 8.
Figure 11:
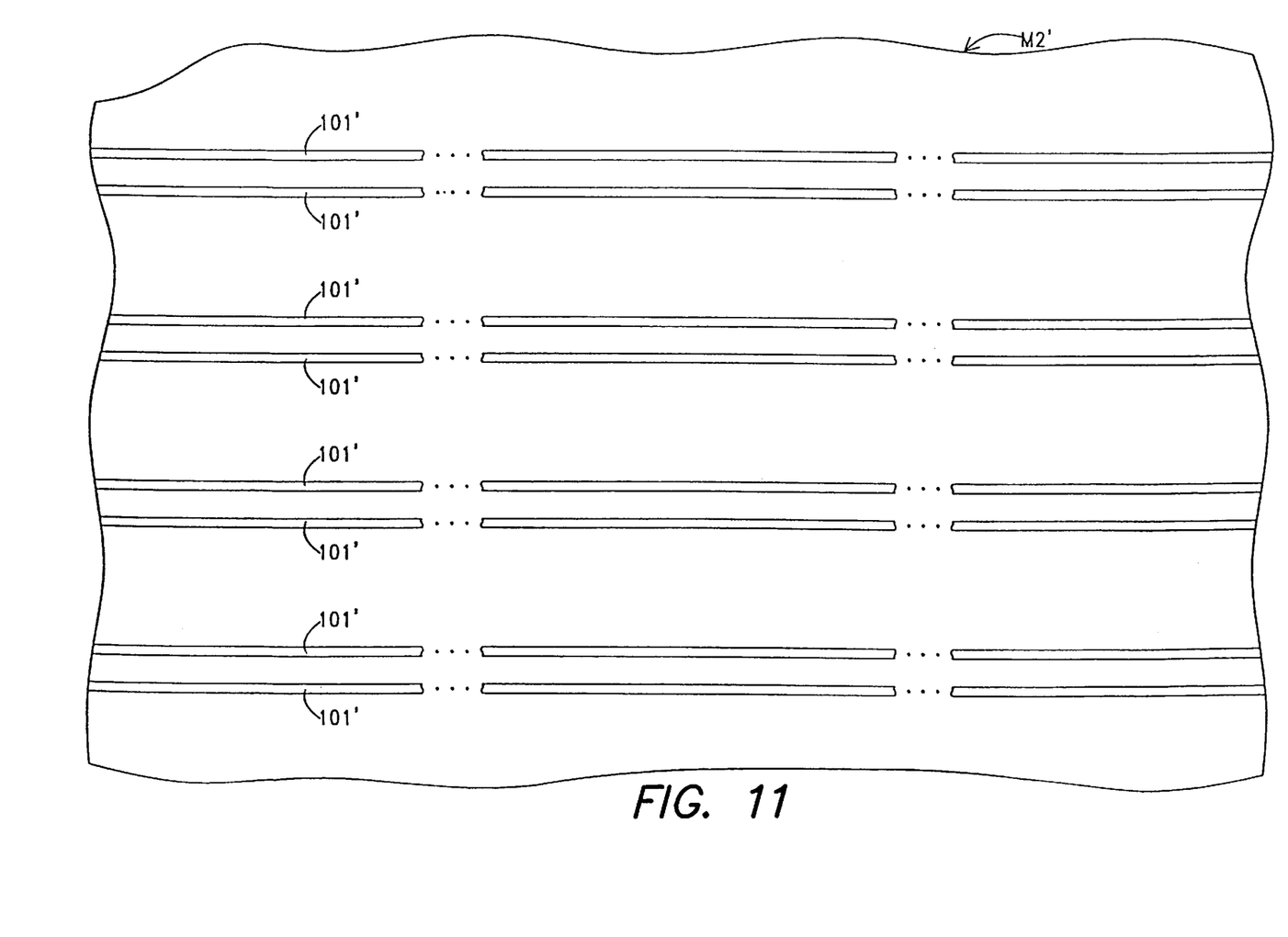
FIG. 11 shows the layout of a mask used for obtaining the word lines of the matrix of FIG. 8.

FIG. 8 shows schematically the top view of the same matrix of FIG. 1, modified using the two manufacturing masks of FIGS. 10 and 11 during the manufacturing process, for obtaining contacts 21' and 22 and word lines 1', respectively. Contacts 21' are numerically half the source diffusion contacts 21 of FIG. 1 and between a contact and the other one there are two source diffusions 4 and four word lines 1', these last being modified compared with the word lines 1 of FIG. 1 in order to leave an area for contacts 21'.

In particular, by reducing the contact size of the source diffusion only the modification of the contact mask is needed.

The drain contacts 22 are a part of the drain contacts 22 of FIG. 1, because those placed in the same horizontal line of contacts 21' are removed: in this way the matrix has as a whole a number of active cells that is half the number shown in FIG. 1.

Figure 9:
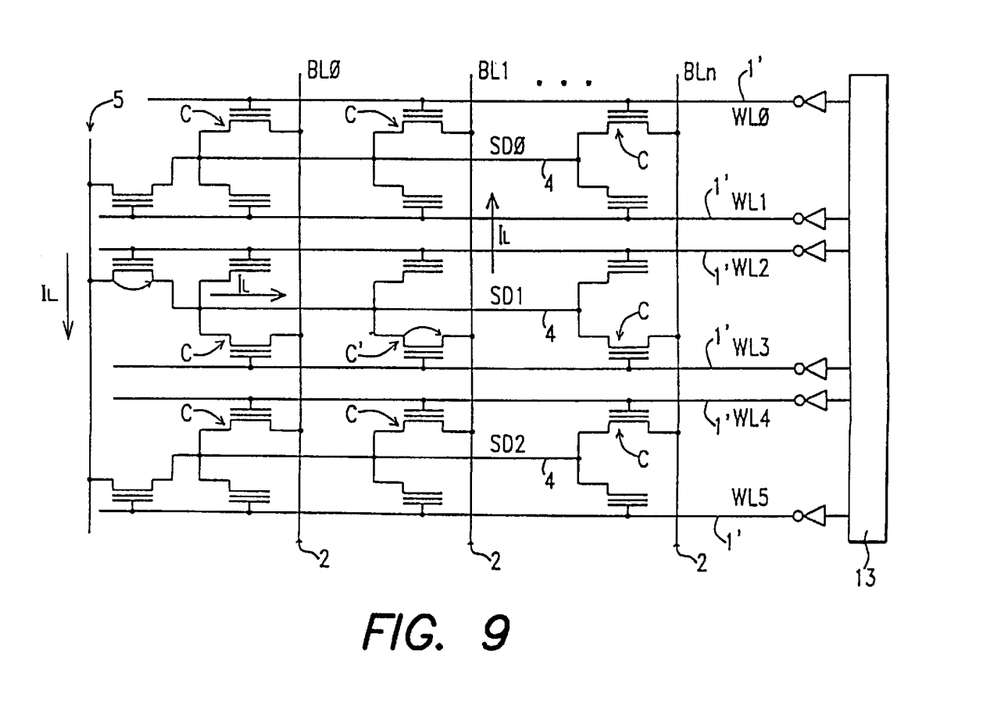
FIG. 9 shows a circuit diagram of the matrix of FIG. 8.

FIG. 9 shows schematically the circuit diagram of the matrix of FIG. 8, wherein it can be noted in a better way the halving of the memory cell number compared to the diagram of FIG. 5.

The defective cell C' localization are obtained as follows: a bit line is biased, e.g. at 1V, and then all the word lines are biased, e.g. at 5V, one at a time keeping the others at ground; just when it appears the leakage current flow in the biased bit line, the defective cell is localized. In the case shown, for example, in FIGS. 8 and 9 wherein the defective cell C' is connected to the bit line BL1 and it comprises the source diffusion SD1, when the bit line BL1 is biased at 1V and the word line WL2 is biased at 5V, keeping the other word lines and bit lines at ground, the channel current flow is obtained between the metal 5 and the source diffusion SD1, and through the defective cell C', which connects electrically the source diffusion SD1 with its drain contact, also in the bit line BL1 a leakage current flow is seen (even if the word line WL3 is biased at ground). In all the remaining cases wherein the other bit lines 2 and word lines 1' are biased, there is no current flow, except for the presence of contact/substrate leakage, in which case it would immediately be localized being independent of the selected word line.

The defective cell is localized in an unambiguous way because other possible source-drain defects in the same bit line do not cause any additional current.

FIG. 10 shows the layout of a mask M1' used during the manufacturing process for forming the drain contacts 22 and the source contacts 21', by means of the windows 122 and 121' respectively, whereas FIG. 11 shows the layout of a mask M2' used for forming the word lines 1', particularly for forming the upper polysilicon of the word lines 1', by means of the windows 101'.

The present invention could be integrated in a test package, sold as an integrated system for application to system reliability problems (e.g. Wafer Level Reliability) or defect problems of the process, to keep substrate defect problems under control. In this case there is a device already designed and manufactured, with the modification of only two masks: clearly, the device functionality is endangered (that of the circuitry is not involved). For reducing farther the costs related to device utilization, few wafers of the whole lot can be used or few devices in the whole exposure field can be changed, leaving the others completely functioning.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Method for localizing point defects causing column leakage currents in a non-volatile memory device, said device comprising a plurality of memory cells arranged in rows and columns in a matrix structure, said columns being connected to drain regions by means of first contacts, source diffusions, and metal lines which connect said source diffusions to each other by means of second contacts, comprising the steps of:

modifying said memory device in order to eliminate a part of said first contacts and all the second contacts, and to form third contacts, which connect said metal lines to drain regions in rows wherein said first contacts have been eliminated, making said source diffusions independent of each other and halving the initial number of said memory cells;

sequentially biasing the single columns of said matrix;

sequentially biasing said single rows of said matrix, keeping biased one column;

localizing a memory cell which presents said point defects, when said leakage current flow occurs.

2. Method according to claim 1, wherein said step of modifying said device comprises a modification of said rows in order to obtain modified rows among which it is possible to form said third contacts without any size problem.

3. Method according to claim 2, comprising steps of forming source regions and drain regions, word lines, bit lines and a subsequent step of forming first and third contacts, characterized in that said step of forming said first and third contacts is accomplished by using a first mask formed in order to obtain the independence of each source diffusion and the localizing of each single defective memory cell by means of said word lines and said bit lines decoding.

4. Method according to claim 3, wherein in said step of forming said word lines a second mask is used in order to obtain modified word lines, instead of said word line, and to have available a larger space for forming said third contacts.

5. Semiconductor non-volatile memory device comprising a plurality of memory cells arranged in rows and columns in a matrix structure, comprising source diffusions independent of each other, metal lines, drain regions, second contacts suitable to connect said metal lines to some of said drain regions, first contacts suitable to connect said columns to other drain regions, in order to localize each single defective memory cell by means of said rows and said columns decoding and survey of a leakage current.

6. Device according to claim 5, wherein each row of said second contacts is interposed between two couples of said rows and two couples of said source diffusions, in each of said couples of rows being comprised a source diffusion, and each row of said first contacts is interposed between two couples of said rows and two rows of said second contacts.

* * * * *